United States Patent [19]

Beaudette

[11] 3,999,084
[45] Dec. 21, 1976

[54] LIMITING AMPLIFIER WITH ADJUSTABLE LIMITS

[75] Inventor: Richard A. Beaudette, Tewksbury, Mass.

[73] Assignee: GTE Laboratories Incorporated, Waltham, Mass.

[22] Filed: July 24, 1975

[21] Appl. No.: 598,610

[52] U.S. Cl. .......................... 307/237; 307/235 N; 307/235 T; 307/264; 328/171; 328/175
[51] Int. Cl.² ........................................ H03K 5/08
[58] Field of Search ............. 307/237, 264, 235 A, 307/235 N, 235 T, 230, 235 R; 328/142, 143, 146, 147, 168, 169, 171, 173, 175; 330/110

[56] References Cited
UNITED STATES PATENTS

| | | | |
|---|---|---|---|
| 3,393,369 | 7/1968 | Embley et al. | 328/175 |
| 3,482,116 | 12/1969 | James | 307/235 N |
| 3,849,734 | 11/1974 | Grass | 330/30 D |
| 3,875,516 | 4/1975 | Thomas | 307/235 A |
| 3,898,573 | 8/1975 | Sherman | 307/237 |
| 3,955,150 | 5/1976 | Soderstrand | 328/167 |

Primary Examiner—John Zazworsky
Assistant Examiner—Marcus S. Rasco
Attorney, Agent, or Firm—Irving M. Kriegsman; Leslie J. Hart

[57] ABSTRACT

A limiting amplifier includes an operational amplifier with three feedback loops. One loop controls the gain of the amplifier when the output signal is between the upper and lower limit. Each of the other two feedback loops comprises the high gain summing amplifier in series with a diode, each summing amplifier comparing the output signal with one of the limit signals. The summing amplifiers insure hard limiting when the output signal tends to exceed the upper or lower limit.

1 Claim, 2 Drawing Figures

LIMITING AMPLIFIER WITH ADJUSTABLE LIMITS

BACKGROUND OF THE INVENTION

The present invention relates to the art of limiting circuits. As used herein, a "limiting circuit" is one whose output signal is constant or substantially constant for all input signals above a critical value.

Limiting circuits have many applications and are especially useful where there is a necessity to achieve waveform shaping, spike suppression or limiting of the dynamic operating range of certain succeeding circuitry. A specific example of a use for such a circuit is in a control system of an automatic process manipulator to limit the dynamic range of the signal applied to subsequent servo amplifiers. A versatile and effective limiting circuit should have several characteristics. First, the limiter should have a convenient means for optimally setting the upper and lower limits; this feature is especially useful during field installation of large, complicated control systems. Also, it is desirable to be able to adjust the limits either statically or dynamically in both positive and negative going directions. Further, it is important to provide hard limiting as opposed to soft limiting. These terms are applied generally when the limiting circuits are unidirectional current conducting devices such as diodes. Generally, limiting by use of diodes is termed soft because of the gradual turn on characteristics of the diodes. The term hard limiting thus refers to the degree to which the errors introduced by this characteristic of diodes are reduced.

Presently known circuits for providing limiting include conventional, as well as zener, diodes used either directly in shunt with a load or as feedback elements in operational amplifier circuits. For example, one simple diode limiter includes a pair of diodes connected back to back in shunt with a load. This limiter is restricted to applications which are fixed to single diode voltage drop levels. Also, the limiting provided is termed soft because of the gradual turn-on characteristics of the diodes. Various diode limiters which produce temperature compensated limiting are known but these limiters also suffer to some degree from the same soft limiting characteristics.

Limiters using operational amplifiers with diodes in the feedback loops have better driving characteristics than the simple diode limiters, but the limiting level is fixed at the zener diode voltage, and such limiters still produce soft limiting due to the gradual turn-on characteristics of the diodes and the limited loop gain available. Transistor limiters are sometimes used. Here, limiting is obtained by driving the transistor into saturation and cutoff. However, this circuit is complicated to implement practically because of the transistor's biasing requirements. Also, this circuit has restricted applications.

A more complicated limiting circuit is that described in the U.S. Pat. No. 3,697,780 issued to Michael et al. This circuit includes a pair of operational amplifiers with feedback networks associated therewith. The input signal to be controlled is applied to the input of the first amplifier. A first reference signal representative of a desired lower limit is applied to the inputs of both of the amplifiers. A second reference signal representative of the upper limit controls the feedback network of the second amplifier. The output signal from the second amplifier is representative of the amplitude of the input signal as long as this signal is above the lower and below the upper limit. However, this circuit is quite complicated and is restricted in use to input signals of only one polarity.

SUMMARY OF THE INVENTION

It is an object of the present invention to provide a circuit providing limiting of a signal when it is necessary to achieve wave shaping, spike suppression or limitation of the dynamic operating range of succeeding circuitry.

It is another object of the present invention to provide a circuit in which the limiting level can be adjusted statically or dynamically in both the positive and negative going directions.

It is an additional object of the present invention to provide a circuit which provides an output which can be accurately limited in excursion from a few millivolts to several volts.

Another additional object of the present invention is to provide a limiting circuit which can be implemented with a single integrated circuit package.

It is still an additional object of the present invention to provide a limiter with greatly reduced temperature dependency as compared to other types of limiters.

Further, it is an object to provide a diode type limiter in which hard limiting is obtained by making the limiter operation independent of the gradual turn on characteristic of the diodes.

According to the present invention, a limiting circuit comprises a summing amplifier for receiving the input signal and providing an output signal, the amplifier having a resistive negative feedback loop. Throughout the linear range of operation, the gain of this amplifier is equal to the ratio of the feedback resistance to the input resistance of the amplifier. Two additional feedback networks are coupled between the output and the input summing junction of the amplifier. Each includes a summing amplifier which compares the output signal with one of the upper or lower limits and a diode coupled to the output of the feedback amplifier. For the upper limit feedback network, the diode conducts when the output signal tends to exceed the upper limit, and for the lower limit network, the diode conducts when the output signal tends to go below the lower limit. The two feedback amplifiers each have a gain such that the diode is forward biased decisively thereby providing hard limiting. The use of a summing amplifier in a feedback loop facilitates ease in adjustment of the magnitude and polarity of the limit. For example, the limit applied to the feedback summing amplifier may be provided through the use of an adjustable voltage divider. Alternatively, any limit voltage from a remote source can be used.

DESCRIPTION OF PREFERRED EMBODIMENTS

Figure 1:
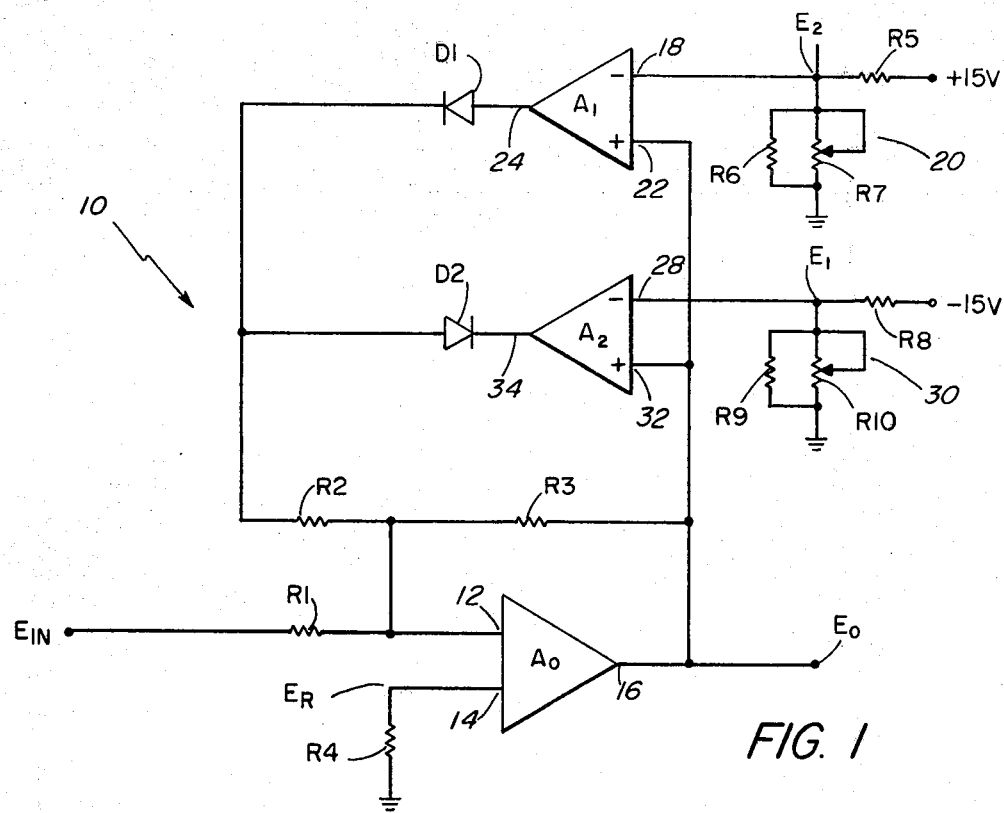
FIG. 1 is a schematic diagram of a limiting circuit according to the principles of the present invention.
Figure 2:
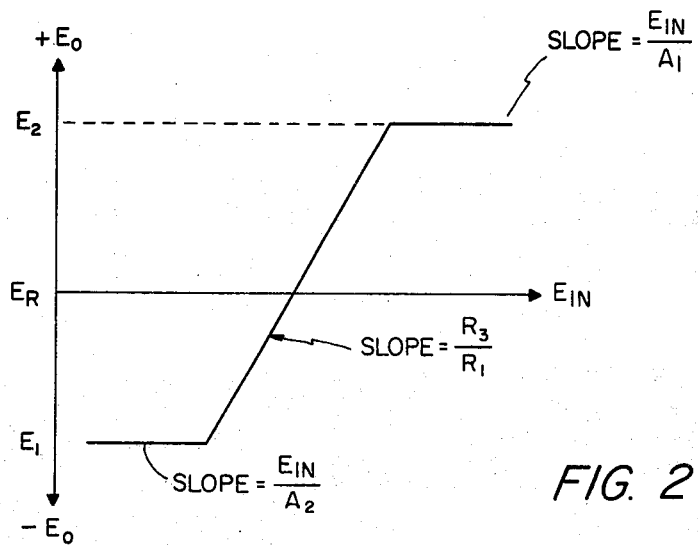
FIG. 2 is a graph of the transfer characteristics of the circuit shown in FIG. 1.

In an exemplary embodiment of the present invention, as illustrated in FIG. 1, there is provided a limiting amplifier circuit represented generally by the reference numeral 10. A first summing amplifier, such as an operational amplifier $A_0$, has a first input 12, a second input 14 and an output 16. A resistor R1 is connected between the first input 12 and an input terminal for the circuit 10 for receiving an input signal $E_{IN}$. The second input 14 is adapted to receive a reference signal designated $E_R$. A resistor R4 is connected between the second input 14 and ground to provide a value of $E_R$ equal to zero volts in the embodiment of FIG. 1. It is to be understood, however, that the value of $E_R$ can be made to be any desired value, either a positive or negative voltage level. The amplifier $A_0$ provides an output signal $E_0$ on the output 16, the output being representative of the difference between $E_{IN}$ and $E_R$. A first negative feedback network is coupled between the output 16 and the first input 12 of the amplifier $A_0$. This network comprises a feedback resistance R3. During the range of linear operation, as illustrated in FIG. 2, an overall gain of the limiting circuit 10 is equal to the ratio of R3 to R1.

According to the present invention, a second feedback network is coupled between the output 16 and the first input 12 of the amplifier $A_0$. This network includes a second summing amplifier $A_1$ and a unidirectional current device, such as a diode $D_1$. The amplifier $A_1$ has a first input 18 adapted to be coupled to a signal representative of an upper limit. The upper limit signal is designated as $E_2$ and is preferably generated by a variable voltage divider network indicated generally by the reference numeral 20. The network 20 comprises a resistor R5, a resistor R6 and a variable resistor R7. A second input 22 is connected to the output 16 of the amplifier $A_0$. An output 24 of the amplifier $A_1$ provides an amplified signal representing the difference between the output signal $E_0$ and the upper limit signal $E_2$. The diode $D_1$, is connected between the output 24 of the amplifier $A_1$ and a resistor R2. The other terminal of the resistor R2 is connected to the first input 12 of the first amplifier $A_0$. In operation, the diode D1 conducts whenever the output signal $E_0$ tends to exceed the upper limit $E_2$.

A third feedback network is coupled between the output 16 of the amplifier $A_0$ and the first input 12 of the amplifier $A_0$. This third network includes a third summing amplifier $A_2$ and a unidirectional current device such as a diode D2. A first input 28 is adapted to be coupled to a source of a lower limit signal designated $E_1$. The lower limit $E_1$ is preferably generated by a variable voltage divider network 30 which includes resistors R8, R9 and a variable resistor R10. A second input 32 of the amplifier $A_2$ is connected to the output 16 of the amplifier $A_0$. An output 34 of the amplifier $A_2$ provides an output signal representing the difference between the output signal $E_0$ and the lower limit $E_1$. The diode D2 is connected to one side of the resistor R2. The diode D2 conducts only when the output 34 of the amplifier $A_2$ is a negative voltage with respect to ground. This occurs whenever the output signal $E_0$ tends to exceed or go below the lower limit $E_1$. All amplifiers preferably are operational amplifiers.

In one important aspect of the invention, when used as a limiter circuit, the amplifiers $A_1$ and $A_2$ have a gain which is adequate to decisively forward bias the diodes D1 and D2 to provide hard limiting. The gain of the amplifiers $A_1$ and $A_2$ ranges from 1 to $10^5$. Preferably, the gain of amplifiers $A_1$ and $A_2$ is in the range of $10^4$ to $10^5$.

Referring now also to FIG. 2, the operation of the circuit 10 is such that the output signal $E_0$ is equal to R3/R1 × $E_{IN}$ until one of the limiting voltages is reached. As an example, when the output signal tends to exceed the value of $E_1$, amplifier $A_1$ provides an output voltage which forward biases the diode D1 to rapidly increase the loop gain of the circuit. The output $E_0$ will now have a value $$\frac{E_{IN}}{A_1 + \frac{R1}{R3}}$$

The ratio, R1/R3, normally becomes insignificant compared to $A_1$, so that $E_0$ can be approximated as:

$$E_0 = \frac{E_{IN}}{A_1},$$

where $A_1$ is the gain of amplifier $A_1$. For an input voltage of 1 volt and for $A_1 = 10^5$, the output voltage is $$E_0 = \frac{1}{10^5}$$

In this way, the circuit 10 produces hard limiting whenever the limit voltage $E_1$ or $E_2$ is exceeded by the output signal.

There are several advantages to the limiting circuit 10, shown in FIG. 1. The limiter circuit 10 has a high input and a low output impedance making it simple to interface with other circuits. The limit voltage levels can be adjusted dynamically from a remote control voltage to change the operating boundaries of the limiter. The transition into the limiting region is well defined and does not exhibit the soft limiting of other methods. Limiting is achievable in the range from plus or minus a few millivolts to tens of volts by simply changing the limit voltages. The circuit can be implemented with a single integrated circuit package such as the commercially available siliconix L 144 or Raytheon 4136 operational amplifiers. The circuit does not suffer from the temperature dependency problems of diode type limiters. The limit voltage sources can have a relatively high impedance such as a potentiometer. Non-symmetrical limiting is possible by changing the value of the reference voltage $E_R$ or using unequal magnitudes for limiting voltage levels $E_1$ and $E_2$. The gain of the linear range of the device can be changed by changing the value of the ratio: R3/R1. The junction of R1 and R3 can be used as a summing junction for several other signals. The limiting level can be controlled very accurately to within a few millivolts because of the high gain amplifiers in the feedback loop.

In one specific embodiment of this invention, the following circuit components were employed.

| Element | Value | Element | Value |
| --- | --- | --- | --- |
| R1 | 10,000 ohms | R4 | 5,100 ohms |
| R2 | 10,000 ohms | R5 | 12,000 ohms |
| R3 | 10,000 ohms | R6 | 2,000 ohms |
| D1 | 1N914 | R7 | 10,000 ohms |
| D2 | 1N914 | R8 | 12,000 ohms |
| $A_0$ | 1/2-747F | R9 | 2,000 ohms |
| $A_1$ | 1/2-7476 | R10 | 10,000 ohms |

| Element | Value | Element | Value |
|---|---|---|---|
| $A_2$ | 1/2-7476 | | |

The embodiment of the present invention is intended to be merely exemplary and those skilled in the art shall be able to make numerous variations and modifications of it without departing from the spirit of the present invention. In its broadest aspect, the present invention comtemplates a circuit for generating an output signal which is a first or a second function of an input signal depending on whether the absolute value of the output signal is below or tends to exceed the absolute value of a limit signal. Thus, only one limit signal may be used or the gain of the feedback amplifier may be low enough so as not to provide a limiting function but to provide a characteristic curve which in the region has a slope other than zero. In another aspect of the invention the means for generating the limit signal is a dynamically variable voltage source to produce a limit signal of variable magnitude and polarity. Thus, the limit signal may be dynamically controlled. Thus, in lieu of the voltage divider network in FIG. 1 there could be utilized a dynamically variable voltage source such as an amplifier which receives some control voltage input. All such variations and modifications are intended to be included within the scope of the present invention as defined by the appended claims.

I claim:

1. A limiting amplifier circuit for generating an output signal which is a function of an input signal so long as the output signal is within a range between an upper limit and a lower limit, comprising:
   a. a reference signal source,
   b. a first summing amplifier having inputs receiving the input signal and the reference signal and providing the output signal which is a function of the difference between the input signal and the reference signal,
   c. a first negative resistive feedback network connected between the input receiving the input signal and an output of the first amplifier to control the gain of the circuit when the output signal is within the upper and lower limits, the gain being established by the ratio of a feedback resistor and an input signal resistor and being substantially equal to one,
   d. means for generating an upper limit signal,
   e. a second feedback network operatively associated with the first amplifier including a second high gain summing amplifier receiving the output signal and the upper limit signal and providing an output which is the amplified difference between the output and the upper limit signals and a unidirectional current device which conducts current when the output signal exceeds the upper limit signal, the second amplifier having a gain which is large enough to decisively forward bias the device to provide hard limiting,
   f. means for generating a lower limit signal,
   g. a third feedback network operatively associated with the first amplifier including a third high gain summing amplifier receiving the output signal and the lower limit signal and providing an output which is the amplified difference between the output and lower limits signals and a unidirectional current device which conducts current when the output signal exceeds the lower limit signal, the third amplifier having a gain which is large enough to decisively forward bias the device to provide hard limiting, and
   h. a current limiting resistor coupled between a junction of the feedback resistor and the input signal resistor and a junction formed by a connection of the unidirectional current conducting devices for the second and third feedback networks at opposed sides which are opposite to the side coupled to the respective summing amplifiers, the current limit resistor limiting the current from both of the second and third feedback networks.

* * * * *